(12) United States Patent
Liu et al.

(10) Patent No.: US 11,776,879 B1
(45) Date of Patent: Oct. 3, 2023

(54) THREE-DIMENSIONAL STACKED PACKAGE STRUCTURE WITH MICRO-CHANNEL HEAT DISSIPATION STRUCTURE AND PACKAGING METHOD THEREOF

(71) Applicant: ZHEJIANG LAB, Hangzhou (CN)

(72) Inventors: Guandong Liu, Hangzhou (CN); Weihao Wang, Hangzhou (CN); Shunbin Li, Hangzhou (CN); Ruyun Zhang, Hangzhou (CN)

(73) Assignee: ZHEJIANG LAB, Hangzhou (CN)

( * ) Notice: Subject to any disclaimer, the term of this patent is extended or adjusted under 35 U.S.C. 154(b) by 0 days.

(21) Appl. No.: 18/306,948

(22) Filed: Apr. 25, 2023

(30) Foreign Application Priority Data

Apr. 28, 2022 (CN) .......................... 202210454688.5

(51) Int. Cl.
*H01L 23/02* (2006.01)
*H01L 23/473* (2006.01)
(Continued)

(52) U.S. Cl.
CPC ........ *H01L 23/473* (2013.01); *H01L 23/3128* (2013.01); *H01L 23/367* (2013.01);
(Continued)

(58) Field of Classification Search
CPC .. H01L 23/367; H01L 23/473; H01L 25/0657
(Continued)

(56) References Cited

U.S. PATENT DOCUMENTS 6,717,812 B1 * 4/2004 Pinjala ................ H01L 25/0657
361/689
7,990,711 B1 * 8/2011 Andry ................. H01L 25/0657
165/80.4
(Continued)

FOREIGN PATENT DOCUMENTS

CN  101740553 A  6/2010
CN  110010571 A  7/2019
(Continued)

OTHER PUBLICATIONS

State Intellectual Property Office of the People's Republic of China, Office Action and Search Report Issued in Application No. 202210454688.5, dated Jun. 14, 2022, 16 pages. (Submitted with Machine/Partial Translation).
(Continued)

*Primary Examiner* — Nitin Parekh
(74) *Attorney, Agent, or Firm* — McCoy Russell LLP

(57) ABSTRACT

The present disclosure discloses a three-dimensional stacked package structure with a micro-channel heat dissipation structure and a packaging method thereof. The three-dimensional stacked package structure includes a chip package portion comprising a multi-layered structure with stacked chips, wherein the stacked chips are provided with through silicon vias and packaged in a three-dimensional stacked packaging manner and a silicon substrate package portion comprising a silicon substrate. The silicon substrate is provided with micro bumps which are to be interconnected with external lead wires. The chip package portion is assembled on the silicon substrate by bonding with the micro bumps. The stacked chips are etched with micro-channels and through holes corresponding to each other. The micro-channels are for coolant flowing in a horizontal direction, and the through holes are for coolant flowing in
(Continued)

upper and lower layers. Sealing rings are arranged around the micro-channels and the through holes.

1 Claim, 2 Drawing Sheets

(51) Int. Cl.
  *H01L 23/498* (2006.01)
  *H01L 23/31* (2006.01)
  *H01L 23/367* (2006.01)
  *H01L 25/065* (2023.01)
  *H01L 23/00* (2006.01)

(52) U.S. Cl.
  CPC ........ *H01L 23/49816* (2013.01); *H01L 24/16* (2013.01); *H01L 25/0657* (2013.01); *H01L 2224/32245* (2013.01); *H01L 2225/06589* (2013.01); *H01L 2924/15311* (2013.01); *H01L 2924/182* (2013.01)

(58) Field of Classification Search
  USPC .......................................... 257/713–714, 774
  See application file for complete search history.

(56) References Cited

U.S. PATENT DOCUMENTS

| | | | | |
|---|---|---|---|---|
| 8,563,365 | B2* | 10/2013 | King, Jr. | H01L 24/06 257/713 |
| 9,691,746 | B2* | 6/2017 | Vadhavkar | H01L 21/54 |
| 2007/0126103 | A1 | 6/2007 | Shi | |
| 2009/0057879 | A1* | 3/2009 | Garrou | H01L 23/481 257/713 |
| 2009/0294954 | A1 | 12/2009 | Bakir et al. | |
| 2010/0117201 | A1* | 5/2010 | Ching | H01L 23/5226 257/E23.141 |
| 2014/0015119 | A1* | 1/2014 | Bonkohara | H01L 25/0657 257/713 |
| 2014/0264759 | A1 | 9/2014 | Koontz et al. | |
| 2015/0021755 | A1* | 1/2015 | Hsiao | H01L 25/0657 257/714 |
| 2017/0358556 | A1* | 12/2017 | Bitz | H01L 25/0657 |
| 2019/0145713 | A1* | 5/2019 | Groothuis | F28D 15/0266 29/890.032 |
| 2020/0013699 | A1* | 1/2020 | Liu | H01L 24/80 |
| 2020/0294968 | A1* | 9/2020 | Sikka | H01L 23/5226 |
| 2020/0328139 | A1* | 10/2020 | Chiu | H01L 25/0657 |
| 2020/0402888 | A1* | 12/2020 | Tsutsui | H01L 25/0657 |

FOREIGN PATENT DOCUMENTS

| | | |
|---|---|---|
| CN | 111653488 A | 9/2020 |
| CN | 114300428 A | 4/2022 |

OTHER PUBLICATIONS

State Intellectual Property Office of the People's Republic of China, Office Action and Search Report Issued in Application No. 202210454688.5, dated Jun. 30, 2022, 17 pages. (Submitted with Machine/Partial Translation).

* cited by examiner

THREE-DIMENSIONAL STACKED PACKAGE STRUCTURE WITH MICRO-CHANNEL HEAT DISSIPATION STRUCTURE AND PACKAGING METHOD THEREOF

CROSS REFERENCE TO RELATED APPLICATION

This application is based upon and claims priority to Chinese Patent Application No. 202210454688.5, filed Apr. 28, 2022, the entire contents of which are incorporated herein by reference.

TECHNICAL FIELD

The present disclosure relates to the field of electronic technologies, in particular to a three-dimensional stacked package structure with a micro-channel heat dissipation structure and a packaging method thereof.

BACKGROUND

Nowadays, with the improvement of the integration of integrated circuits, the number of transistors integrated per unit area is increasing, and the power consumption is rising rapidly. On the other hand, with the shrinking of transistor feature size, Moore's Law approaches the limit, and people consider stacking planar integrated circuits in a three-dimensional manner to further enhance the integration. The increasing integration of transistors and a three-dimensional stacked structure put forward higher requirements for chip heat dissipation. Liquid cooling is a technology to cool heating modules in electronic devices by flowing liquid. In order to cool liquid inside a chip, it is necessary to etch micro-channels for the liquid to flow inside the chip. For the three-dimensional stacked structure, the traditional heat dissipation method is to etch micro-channels on a back of a silicon adapter plate and a special silicon substrate, then bond them to form closed micro-channels, and finally stack them in the three-dimensional manner. The method of bonding with a micro-channel substrate first, and then stacking in a multi-layered manner not only increases the complexity of the process, but also increases the overall height of the device.

SUMMARY

In order to solve the above technical problems existing in the related art, the present disclosure provides a three-dimensional stacked package structure with a micro-channel heat dissipation structure and a packaging method thereof. By directly etching micro-channels on a multi-layered structure with stacked chips with through silicon vias (TSVs), and using copper or copper/tin materials that are completely compatible with TSV materials, processes and heights to make sealing rings of the micro-channels, it is possible to achieve three-dimensional stacking and micro-channel sealing while performing one-step bonding, which not only reduces the complexity of the process, but also does not increase the overall height of the device, and can also realize wafer-level bonding. The specific technical solutions are as follows.

The present disclosure provides a three-dimensional stacked package structure with a micro-channel heat dissipation structure, including a chip package portion and a silicon substrate package portion, wherein the chip package portion includes a multi-layered structure with stacked chips, wherein the stacked chips are provided with through silicon vias and packaged in a three-dimensional stacked packaging manner; the silicon substrate package portion includes a silicon substrate, wherein the silicon substrate is provided with micro bumps which are to be interconnected with external lead wires; the chip package portion is assembled on the silicon substrate by bonding with the micro bumps; the stacked chips are etched with micro-channels and through holes corresponding to each other; the micro-channels are for coolant flowing in a horizontal direction; the through holes are for coolant flowing in upper and lower layers; and the micro-channels and the through holes are provided with sealing rings around.

In one embodiment, the silicon substrate is provided with micro-channels.

In one embodiment, the stacked chips include a bottom chip, a middle-layer chip and a top chip, all of which are provided with through silicon vias, micro bumps, micro-channels and sealing rings with corresponding interlayer positions;

an upper surface of the bottom chip is etched with micro-channels, and sealing rings are arranged around the micro-channels;

the middle-layer chip is etched with through holes and micro-channels connected with the through holes, and sealing rings are arranged around the micro-channels and the through holes;

the top chip is etched with a coolant inlet and outlet, a lower surface of the top chip is etched with micro-channels, and sealing rings are arranged around the coolant inlet and outlet and the micro-channels.

In one embodiment, both the micro bumps and the sealing rings are formed by electroplating after photolithography, and the micro bumps and the sealing rings are made of substantially same material with substantially same thickness and are located on a same process level.

In one embodiment, metal materials used for sputtering a seed layer of the sealing rings are titanium/copper, wherein a titanium layer plays a role as an adhesion layer and has a thickness of 300 Å to 500 Å, and a copper layer plays a role as a seed layer and has a thickness of 3000 Å to 5000 Å.

The present disclosure provides a packaging method for forming the three-dimensional stacked package structure with the micro-channel heat dissipation structure, including: preparing a metal for sputtering a seed layer on a surface of a multi-layered structure with stacked chips, wherein the stacked chips are provided with through silicon vias; patterning micro bumps and sealing rings by photoetching; electroplating the micro bumps and the sealing rings; removing photoresist and the seed layer after the electroplating; etching an upper surface and a lower surface of the stacked chips to form micro-channels and through holes with micron depth, wherein the micro-channels are for coolant flowing in a horizontal direction, and the through holes are for coolant flowing in upper and lower layers; stacking the stacked chips in a three-dimensional manner, performing a one-step bonding process to realize a bonding between the through silicon vias with the micro bumps and a bonding between the micro-channels and the sealing rings; and assembling the stacked chips on the silicon substrate by bonding with the micro bumps.

In one embodiment, the one-step bonding process includes copper-tin solder bonding or copper-copper hot pressing bonding, the copper-tin solder bonding has a bonding temperature of 300° C. to 350° C., a bonding pressure of 0.5 MPa to 1 MPa, and a bonding time of 15 min to 60 min.

In one embodiment, the metal on the surface of each of the stacked chips for sputtering the seed layer is made of titanium/copper.

Compared with the related art, the present disclosure has following advantages.

Firstly, the micro-channels and the through holes for the coolant to flow in the chip are directly made on the chip, and the micro-channels are completely formed into a closed pipeline by a multi-layered structure with stacked chips stacking process without introducing other special bonding processes and bonding substrates, thereby not only reducing the process complexity and cost, but also not increasing the overall thickness of the three-dimensional stacked structure.

Secondly, in the embodiment of the present disclosure, the sealing rings of the micro-channels and the through holes are simultaneously arranged on the same process level when the micro bumps of the chip are manufactured, and thus have the same material and height as the micro bumps; further, the bonding of the micro-channels and the sealing rings and the bonding of the micro bumps of the through silicon vias are completed by the one-step bonding process under the same process conditions without introducing other special sealing ring materials and bonding processes.

Thirdly, the structures for cooling the liquid, for example, the micro-channels, the through holes, sealing rings, and the like, can be manufactured together with the through silicon vias and the micro bumps of the chip by the wafer-level process, and the corresponding stacking process can use a wafer-level three-dimensional stacking package or a chip-level three-dimensional stacking package.

Figure 1:
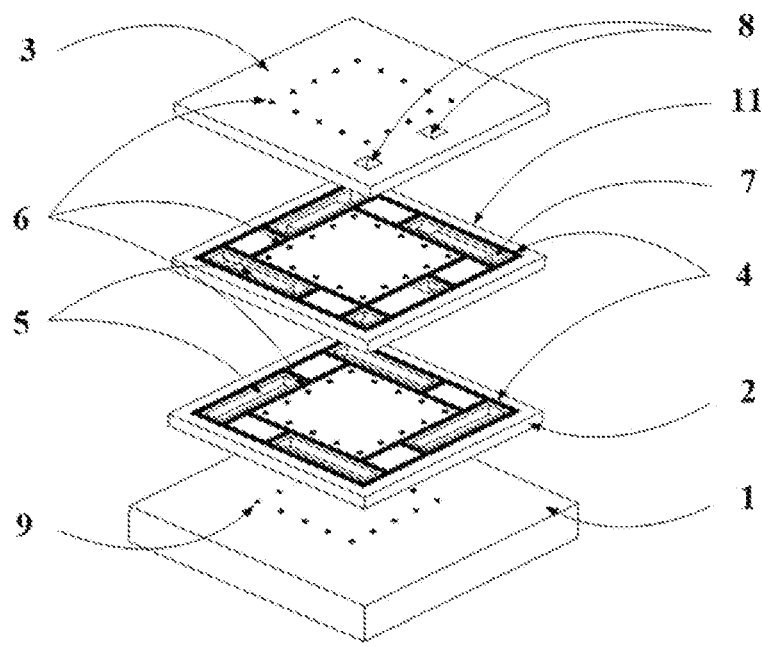
FIG. 1 is a schematic diagram of a three-dimensional stacked package structure with a micro-channel heat dissipation structure according to an embodiment of the present disclosure.

In the drawings, "1" represents a silicon substrate, "2" represents a bottom chip, "3" represents a top chip, "4" represents a sealing ring, "5" represents a micro-channel, "6" represents a through silicon via, "7" represents a through hole, "8" represents a coolant inlet and outlet, "9" represents micro bumps, "10" a silicon substrate with micro-channels, and "11" represents a middle-layer chip.

DETAILED DESCRIPTION OF THE EMBODIMENTS

In order to make the objectives, technical solutions and technical effects of the present disclosure more clearly, the present disclosure will be further explained in detail below in combination with the accompanying drawings of the specification.

As shown in FIG. 1, in an embodiment of the present disclosure, taking a micro-channel around a chip with through silicon vias (TSVs) as an example, however, a shape of the micro-channel can be arranged according to actual requirements, or a plurality of micro-channels can be added for multipath cooling, and the application scope of the present disclosure is not limited to the embodiment.

A three-dimensional stacked package structure with a micro-channel heat dissipation structure provided by of the present disclosure is composed of a chip package portion and a silicon substrate package portion, wherein the chip package portion is stacked on the silicon substrate package portion.

The chip package portion is composed of a multi-layered structure with stacked chips, wherein the stacked chips are provided with through silicon vias, the silicon substrate package portion is composed of a silicon substrate 1, and the stacked chips with the through silicon vias are stacked on the silicon substrate 1 to form the three-dimensional stacked package structure.

The stacked chips with the through silicon vias include a bottom chip 2, a middle-layer chip 11 and a top chip 3, wherein the bottom chip 2, the middle-layer chip 11 and the top chip 3 are all provided with the through silicon vias (TSVs) 6, micro bumps 9, micro-channels 5 and sealing rings 4 with corresponding interlayer positions, wherein the sealing rings 4 and the micro bumps 9 are formed by electroplating after photolithography, that is, a shape of the micro bumps 9 and a shape of the sealing rings 4 are first photoetched on a surface of the chip, then the micro bumps 9 and the sealing rings 4 are electroplated, and photoresist and a seed layer are removed after electroplating.

Figure 2A:
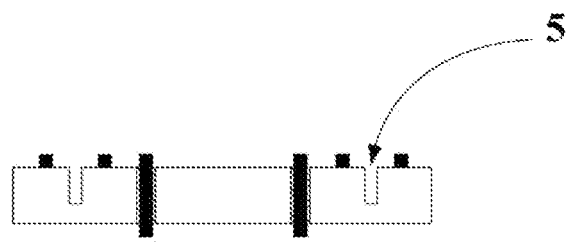
FIG. 2a is a schematic diagram of a cross-sectional structure of a bottom chip according to an embodiment of the present disclosure.

As shown in FIG. 2a, an upper surface of the bottom chip 2 is further etched with micro-channels 5, and the sealing rings 4 are arranged around the micro-channels 5. Specifically, the heat dissipation structure of this layer of chip is arranged as follows: a shape of the micro bumps 9 and a shape of the sealing rings 4 are photoetched on the upper surface of the chip, the micro bumps 9 and the sealing rings 4 are electroplated at the same time, the micro bumps 9 are arranged on a lower surface, and finally the micro-channels 5 are etched on the upper surface of the chip.

Figure 2B:
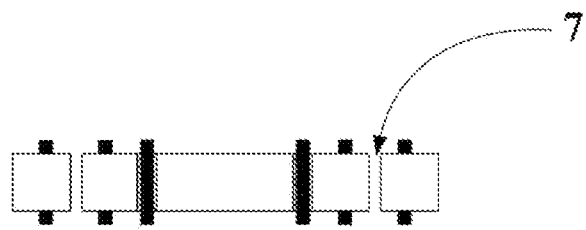
FIG. 2b is a schematic diagram of a cross-sectional structure of a middle-layer chip according to an embodiment of the present disclosure.

As shown in FIG. 2b, the middle-layer chip 11 is also etched with through holes 7, and the micro-channels 5 of this layer is connected with the through holes 7, and the sealing rings 4 are arranged around the micro-channels 5 and the through holes 7. Specifically, the heat dissipation structure of this layer of chip is arranged as follows: both the shape of the micro bumps 9 and the shape of the sealing rings 4 are photoetched on an upper surface and a lower surface of the chip, the micro bumps 9 and the sealing rings 4 are electroplated at the same time; and finally the through holes 7 for making coolant flow in an upper layer and a lower layer and the micro-channels 5 connected with the through holes 7 for making the coolant flow in a horizontal direction of this layer are etched on the chip.

Figure 2C:
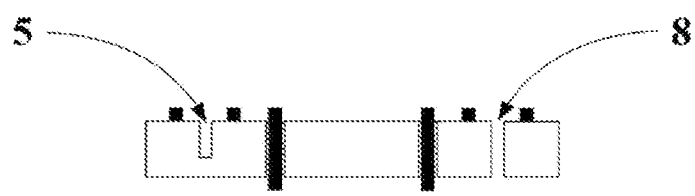
FIG. 2c is a schematic diagram of a cross-sectional structure of a top chip according to an embodiment of the present disclosure.

As shown in FIG. 2c, the top chip 3 is also etched with a coolant inlet and outlet 8, a lower surface of the top chip 3 is etched with the micro-channels 5, and the sealing rings 4 are arranged around the coolant inlet and outlet 8 and the micro-channels 5. Specifically, the heat dissipation structure of this layer of chip is arranged as follows: the shape of the micro bumps 9 and the shape of the sealing rings 4 are photoetched on the lower surface of the chip, the micro bumps 9 and the sealing rings 4 are electroplated at the same time, the micro bumps 9 are arranged on the upper surface, and finally the micro-channels 5 and the coolant inlet and outlet 8 are etched on the lower surface of the chip respectively.

Preferably, the manufacturing process of the sealing rings 4 is sputtering a titanium/copper seed layer, wherein an adhesion layer of the titanium has a thickness of 300 Å to 500 Å, and a copper seed layer has a thickness of 3000 Å to 5000 Å. The shapes of the micro bumps 9 and the sealing rings 4 are photoetched on the surface of the stacked chips, then the micro bumps 9 and the sealing rings 4 are electroplated, and photoresist and the seed layer are removed after electroplating.

Figure 2D:
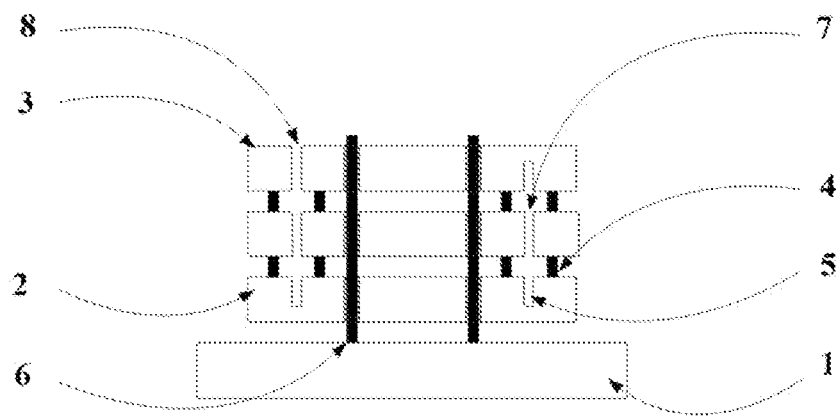
FIG. 2d is a schematic diagram of a cross-sectional structure of a chip package portion assembled with a silicon substrate according to an embodiment of the present disclosure.

As shown in FIG. 2d, the bottom chip 2, the middle-layer chip 11 and the top chip 3 are stacked and assembled on the silicon substrate 1 through the micro bumps 9.

Figure 2E:
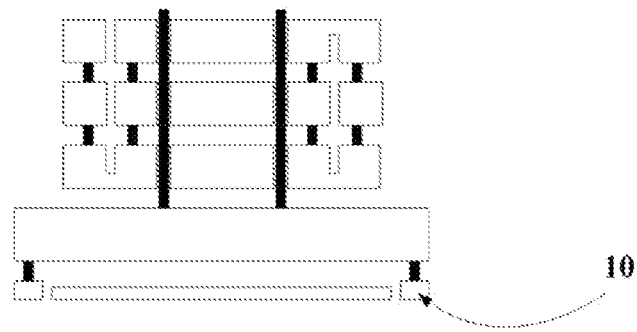
FIG. 2e is a schematic diagram of a cross-sectional structure of a chip package portion assembled with a silicon substrate with micro-channels according to an embodiment of the present disclosure.

As shown in FIG. 2e, the three-dimensional stacked structure with the micro-channels is assembled on a silicon substrate 10 with the micro-channels.

Figure 3:
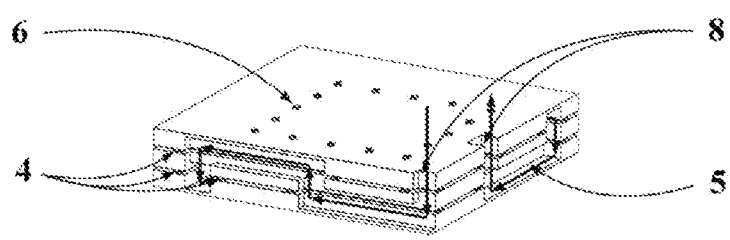
FIG. 3 is a schematic diagram of a cross-sectional structure of liquid heat dissipation of a chip package portion according to an embodiment of the present disclosure.

As shown in FIG. 3, a flow direction of liquid of the three-dimensional stacked structure with the micro-channels when the liquid dissipates heat.

Figure 4:
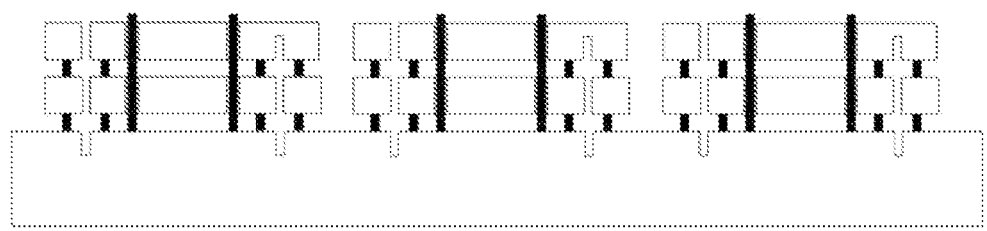
FIG. 4 is a schematic diagram of a cross-sectional structure for packaging chip-level stacked structures with different functions and micro-channels on a silicon substrate wafer.

The micro-channels 5 as the heat dissipation structure are fabricated on the stacked chips without introducing other special heat dissipation structures and processes incompatible with bonding with the micro bumps 9, therefore, the chip package portion and the silicon substrate package portion can be diced after wafer stacking, or stacked after dicing, or chip-level stacked structures with different functions can be packaged on the silicon substrate wafer after wafer stacking. As shown in FIG. 4, a plurality of chip-level stacked structures with the micro-channels and different functions are packaged on a silicon substrate wafer with the micro-channels.

A packaging method for forming the three-dimensional stacked package structure with the micro-channel heat dissipation structure provided by of the present disclosure is that stacking a chip package portion on a silicon substrate package portion.

In the chip package portion, firstly, a metal for sputtering a seed layer is arranged on a surface of a multi-layered structure with stacked chips, wherein the stacked chips are provided with through silicon vias, preferably, the metal materials for sputtering the seed layer are titanium/copper; shapes of micro bumps and sealing rings are photoetched, and the micro bumps 9 and the sealing rings 4 are simultaneously electroplated; photoresist and the seed layer are removed after electroplating; then micro-channels 5 and through holes 7 with micron depth are etched on the upper surface and the lower surface of the chip with the through silicon vias 6 and the micro bumps 9, wherein the micro-channels 5 are used for making coolant flow in a horizontal direction, and the through holes 7 are used for making the coolant flow in the upper layer and lower layer; finally, the stacked chips are stacked in a three-dimensional manner, and preferably, copper/tin bonding or copper/copper bonding is used to simultaneously complete the bonding of the through silicon vias 6 and micro bumps 9 and the bonding of the micro-channels 5 and the sealing rings 4 in the upper layer chip and lower layer chip by one-step bonding process under exactly the same process conditions; signals are transmitted among the stacked chips through the micro bumps 9 after bonding, and the heat generated inside the stacked chips is taken away by the coolant flowing in a closed pipeline formed by the micro channels 5, the through holes 7 and the sealing rings 4.

The coolant inlet and outlet of the closed pipeline is located on an outer surface of the three-dimensional stacked structure of the present disclosure, that is, the micro-channels 5, the through holes 7 and the sealing rings 4 located on the surface of the three-dimensional stacked chip itself form the closed pipeline for the coolant to flow inside the three-dimensional stacked chip without introducing other special bonding processes and bonding substrates.

The sealing rings 4 of the micro-channels 5 and the through-holes 7 are manufactured and arranged on the same process level at the same time when the micro bumps of the chip are manufactured; the micro bumps 9 and the sealing rings 4 of the stacked chips have exactly the same material and thickness and are located on the same process level; and the bonding of the through silicon vias 6 and micro bumps 9 and the bonding of the micro-channels 5 and the sealing rings 4 in the upper layer chip and lower layer chip are simultaneously completed by one-step bonding process under the same process conditions during packaging.

In the silicon substrate package portion, the micro bumps 9 interconnected with lead wires are arranged on the silicon substrate 1. During packaging, the three-dimensional stacked structure with the micro-channels 5 is bonded and assembled on the silicon substrate 1 through the micro bumps 9 to realize the extraction of electrical signals.

The method can be used for wafer-level three-dimensional stack packaging, or can be used for chip-level three-dimensional stack packaging, or can also be used to package chip-level three-dimensional stack structures with different functions on a wafer-level silicon substrate.

Since the sealing rings 4 for sealing the micro-channels 5 and the micro bumps 9 for three-dimensional stacking of the TSVs are made of the same material and the same thickness, the bonding of the micro bumps 9 and the sealing of the micro-channel 5 can be simultaneously realized by one-step process under the same process conditions such as temperature, pressure, and time. In addition, since the sealing rings 4 of the micro-channels 5 and the micro bumps 9 of the TSVs are located on the same process level, the three-dimensional stacking method is suitable for both the wafer-level packaging and the chip-level packaging, without slicing first and then packaging. The bonding between the micro bumps 9 with the sealing rings 4 can be performed by copper-tin solder bonding or copper-copper hot pressing bonding, and preferably, the copper-tin solder bonding has a bonding temperature of 300° C. to 350° C., a bonding pressure of 0.5 MPa to 1 MPa, and a bonding time of 15 min to 60 min.

Those mentioned above are only the preferred embodiments of the present disclosure, rather than limiting the present disclosure in any form. Although the implementation process of present application has been explained in detail in the preceding text, for those of skilled in the art, the technical solutions recorded in the above-mentioned embodiments can be modified, or a part of the technical features can be equivalently alternated. Any modification or equivalent alternation within the spirit and principle of the present disclosure will fall within the protection scope of the present disclosure.

The invention claimed is:

1. A three-dimensional stacked package structure containing a micro-channel heat dissipation structure, comprising a chip package portion and a silicon substrate package portion, wherein the chip package portion is composed of a multi-layered chip containing through silicon vias in a three-dimensional stacked packaging manner; the silicon substrate package portion is composed of a silicon substrate, the silicon substrate is provided with micro bumps interconnected with external leads respectively, and the chip package portion is assembled on the silicon substrate in a micro bump bonding manner; the multi-layered chip is etched to form micro-channels and through holes corresponding to each other, wherein the micro-channels are configured to provide cooling liquid flow in a horizontal direction, and the through holes are configured to provide the cooling liquid flow in an upper layer and a lower layer; and sealing rings are arranged around the micro-channels and the through holes;

the silicon substrate being formed with micro-channels;

the multi-layered chip comprises a bottom chip, a middle-layer chip and a top chip, and each of which is provided with the through silicon vias, the micro bumps, the micro-channels and the sealing rings with corresponding interlayer positions;

an upper surface of the bottom chip is etched to form the micro-channels, and the sealing rings are arranged around the micro-channels;

the middle-layer chip is etched to form the through holes, micro-channels connected with each other via the through holes respectively are etched on the upper surface and a lower surface of the middle-layer chip, and positions of micro-channels on an upper surface and a lower surface of a same side of the middle-layer chip are staggered, a structure that the micro-channels etched on the lower surface of the middle-layer chip are connected with the respective through holes corresponds to positions of the micro-channels on the bottom chip, and the sealing rings are arranged around the micro-channels and the through holes;

the top chip is etched to form a cooling liquid inlet and an outlet, the cooling liquid inlet and outlet are connected with respective through holes at one side of the middle-layer chip, a lower surface of the top chip is etched to form micro-channels corresponding to a position of a structure that the micro-channels etched on the upper surface of the middle-layer chip is connected with the respective through holes, and the sealing rings are arranged around the cooling liquid inlet and outlet and the micro-channels;

the micro-channels of the bottom chip, providing a structure wherein the micro-channels of the middle-layer chip and the through holes being connected respectively, and the micro-channels and the cooling liquid inlet and outlet of the top chip are sealed by the respective sealing rings to form a continuous micro-channel heat dissipation structure for cooling liquid to flow among the bottom chip, the middle-layer chip and the top chip in a vertical direction and on the bottom chip, the middle-layer chip and the top chip in the horizontal direction;

both the micro bumps and the sealing rings are formed by electroplating after photolithography, and the micro bumps and the sealing rings have exactly a same material and thickness and are located on a same process level;

a metal used by the sealing rings for sputtering a seed layer is titanium or copper, wherein an adhesion layer of the titanium has a thickness of 300 Å to 500 Å, and the copper seed layer has a thickness of 3000 Å to 5000 Å.

* * * * *